(12) United States Patent
Martens et al.

(10) Patent No.: US 9,800,258 B2
(45) Date of Patent: Oct. 24, 2017

(54) CIRCUIT FOR STABILIZING A DIGITAL-TO-ANALOG CONVERTER REFERENCE VOLTAGE

(71) Applicant: IMEC VZW, Leuven (BE)

(72) Inventors: Ewout Martens, Heverlee (BE); Jan Craninckx, Boutersem (BE)

(73) Assignee: IMEC VZW, Leuven (BE)

(*) Notice: Subject to any disclaimer, the term of this patent is extended or adjusted under 35 U.S.C. 154(b) by 0 days.

(21) Appl. No.: 15/373,578

(22) Filed: Dec. 9, 2016

(65) Prior Publication Data

US 2017/0179974 A1    Jun. 22, 2017

(30) Foreign Application Priority Data

Dec. 17, 2015 (EP) .................................... 15200700

(51) Int. Cl.
*H03M 1/10* (2006.01)
*H03M 1/66* (2006.01)
*H03M 1/46* (2006.01)

(52) U.S. Cl.
CPC .......... *H03M 1/66* (2013.01); *H03M 1/1009* (2013.01); *H03M 1/1071* (2013.01); *H03M 1/466* (2013.01)

(58) Field of Classification Search
CPC .... H03M 1/66; H03M 1/1009; H03M 1/1071; H03M 1/466
USPC ................................ 341/120, 150, 163, 172
See application file for complete search history.

(56) References Cited

U.S. PATENT DOCUMENTS 9,154,151 B1    10/2015  Leong
9,223,332 B1 *  12/2015  Himmelbauer ........... G05F 3/02

OTHER PUBLICATIONS

European Search Report, European Patent Application No. 15200700.1, dated Jun. 28, 2016, 12 pages.
(Continued)

*Primary Examiner* — Khai M Nguyen
(74) *Attorney, Agent, or Firm* — McDonnell Boehnen Hulbert & Berghoff LLP

(57) ABSTRACT

The disclosure relates to a circuit for stabilizing a digital-to-analog converter reference voltage. One example embodiment is a circuit for stabilizing a voltage on a reference node. The circuit includes a digital-to-analog converter that includes an array of capacitors and arranged for: receiving an input voltage via an input node, receiving a voltage via a reference node and a digital-to-analog code via a controller node, and outputting a digital-to-analog output voltage. The circuit also includes a capacitive network on the reference node comprising a fixed capacitor arranged to be pre-charged to an external reference voltage and a variable capacitor arranged to be pre-charged to an external auxiliary voltage. Further, the circuit includes a measurement block. In addition, the circuit includes a calibration block arranged for determining an updated setting of the variable capacitor based on the digital-to-analog code and the measured voltage on the reference node.

20 Claims, 10 Drawing Sheets

(56) References Cited

OTHER PUBLICATIONS

Elumalai, Iniyavan, "A Capacitance-Based Reference Scheme for a 14b-Linear, 100 MS/s SAR-Assisted Pipeline ADC", Master of Science Thesis, for the degree of Master of Science in Microelectronics at Delft University of Technology, Aug. 21, 2012, 103 pages.
Stepanovic, Dusan, "Calibration Techniques for Time-Interleaved SAR A/D Converters", Electrical Engineering and Computer Sciences, University of California at Berkeley, Technical Report No. UCB/EECS-2012-225, Dec. 4, 2012, 116 pages.

* cited by examiner

CIRCUIT FOR STABILIZING A DIGITAL-TO-ANALOG CONVERTER REFERENCE VOLTAGE

CROSS-REFERENCE TO RELATED APPLICATIONS

The present application is a non-provisional patent application claiming priority to European Patent Application No. EP 15200700.1, filed Dec. 17, 2015, the contents of which are hereby incorporated by reference.

FIELD OF THE DISCLOSURE

The present disclosure relates to the field of high speed analog-to digital converters and more particularly to capacitive digital-to-analog converters (DACs) as used therein.

BACKGROUND

High-speed analog-to-digital converters (ADCs) often use a capacitive DAC to generate a voltage residue after a coarse conversion that is further quantized to increase the overall conversion resolution. The accuracy for this residue generation is imposed by the required overall accuracy of the total ADC. For example, the DAC used in the first stage of a 14-bit linear ADC pipelined SAR ADC may require more than 14 bit linearity, although its own resolution can be limited to only a few bits. FIG. 1 shows an example of a 6-bit capacitive DAC with an input voltage $V_{in}$ sampled on the top plate before the DAC is switched via the bottom plates of the capacitors to generate the output voltage $V_{out}$.

In general, the output voltage of a DAC as in FIG. 1 above with a resolution of N bits is $V_{out}=V_{in}-V_{dac}$ with $$V_{dac}=V_{offset}+\Sigma_{k=0}^{N-1}b_k V_{ref} \quad (1)$$

wherein $V_{ref}$ denotes a reference voltage and $V_{offset}$ a fixed offset voltage independent of the input voltage $V_{in}$. The coefficients $b_k$ correspond to a coarse digitalization of the input voltage $V_{in}$.

The non-linearity arises from a mismatch on the coefficients $b_k$ which may be binary scaled, and from the variation of the reference voltage $V_{ref}$ with the input code $b_{N-1} \ldots b_0$. In a capacitive DAC the coefficients are determined by ratios of capacitors. Hence, capacitor mismatch introduces linearity errors. Various techniques exist to compensate for these errors, like calibration, digital compensation or just increasing the area or size of the capacitors to decrease the mismatch.

When a capacitive DAC switches, it draws some charge from the reference node. This amount of charge depends on the code applied at the input of DAC. With an ideal voltage source at the reference, this code-dependent charge does not change the voltage $V_{ref}$ on the reference node. In reality, however, the reference node is either driven by an on-chip buffer or it is connected to an external pin. With an on-chip buffer the voltage on the reference node drops each time the DAC switches and it takes some time to settle to the target reference voltage as shown in FIG. 2. A buffer with a small output impedance may be used. The drop depends on the DAC input code $b_{N-1} \ldots b_0$. The settling time is determined by an RC time constant with R the buffer output impedance and C a fraction of the DAC capacitance. To make the DAC linear, one has to wait until the voltage on the reference node is settled close enough to the target reference voltage. This puts a limitation on the speed that can be obtained with the DAC.

When the reference node is connected to an external pin, the inductance of the bond wire causes code-dependent ringing on the reference node each time the DAC switches, as shown in FIG. 3. Again, extra delay may be added before the DAC output can be used with the correct reference voltage. Alternatively, a large decoupling capacitor can be put on-chip which may occupy a significant amount of chip area.

It has been proposed in the art to stabilize the reference by adding a capacitive network on the reference node as shown in FIG. 4. The fixed capacitor $C_{ref}$ is pre-charged to the nominal reference voltage $V_{ref}$ and a variable capacitor $C_{aux}$ to a pre-charge voltage $V_{aux}$. This voltage $V_{aux}$ can be any voltage different from $V_{ref}$ but for practical reasons the most straightforward choice is the electrical ground (zero). For a certain DAC configuration and a certain DAC switching event, the charge for the DAC can be computed as well as the value of $C_{aux}$ to make the total charge drawn from $C_{ref}$ independent of the selected DAC code. To achieve this code-independent $Q_{ref}$, the correct mapping of DAC code onto setting for $C_{aux}$ should be implemented as indicated in FIG. 4.

The proposed scheme, however, also poses some limitations on the ADC in terms of speed and accuracy. After the DAC has switched and the residue has been processed, the DAC may go back to the initial situation to be ready for the new sample. This DAC resetting also draws a code-dependent charge from the reference capacitor $C_{ref}$. An example for a 6-bit capacitive DAC is shown in FIG. 5. It shows the voltage on the DAC reference node after switching the DAC to generate the residue (squares) including the $C_{aux}$, and after resetting the DAC back to its initial state (dots). To ensure $C_{ref}$ is pre-charged back to $V_{ref}$ with sufficient accuracy over all codes, it needs enough time to settle during the pre-charging phase which results in a speed penalty.

An optimized value for $C_{aux}$ depends on the DAC characteristics as well as on the reference capacitance $C_{ref}$ and the external voltages $V_{ref}$ and $V_{aux}$. Due to process variations it is difficult to estimate them with high accuracy and, hence, to know a DAC code mapping onto a setting for $C_{aux}$. Furthermore, changes in the external reference voltages are not accounted for at all.

When the DAC is used in a traditional SAR algorithm, it switches N times and draws N times charge from $C_{ref}$. Consequently, the compensation with $C_{aux}$ takes N times the time to find the correct value for $C_{aux}$ and switch it. Retrieving the correct value for $C_{aux}$ is usually also time-consuming especially when it requires access to a memory. One way to reduce this problem is to use the $C_{aux}$ only in the first few steps of the algorithm.

Time-interleaving is typically employed to increase the total conversion speed of ADCs. The scheme presented in FIG. 4, however, may include a tunable capacitor $C_{aux}$ for each channel. For large interleaving factors, this results in an increase of the occupied area.

In a time-interleaved ADC with multiple channels, a different final reference voltage per channel—albeit independent over the codes within a channel—results in gain mismatches between the channels as can be derived from equation (1). These mismatches introduce spurs which limit the overall accuracy. In order to compensate for these gain mismatches, digital correction can be considered but that comes at the cost of a considerably increased complexity.

Hence, there is room for improvement, so that at least one or more of these drawbacks of alternative schemes may be solved or avoided.

SUMMARY

Some embodiments provide for a stabilizing circuit wherein at least some of the above-mentioned limitations are avoided or overcome.

The above objective may be accomplished according to disclosed embodiments.

In a first aspect, disclosed embodiments relate to a circuit for stabilizing a voltage on a reference node comprising
- a digital-to-analog converter, DAC, comprising an array of capacitors and arranged for receiving an input voltage via an input node, a voltage via a reference node and a DAC code via a controller node, wherein the DAC code indicates to which capacitors of the array the voltage is to be applied, and for outputting a DAC output voltage,
- a capacitive network on the reference node comprising a fixed capacitor arranged to be pre-charged to an external reference voltage and a variable capacitor arranged to be pre-charged to an external auxiliary voltage and to be connected afterwards to the reference node,
- a measurement block arranged for measuring the actual voltage on the reference node,
- a calibration block arranged for being fed with the DAC code and the measured actual voltage and for determining an updated setting of the variable capacitor based on the DAC code and the measured actual voltage.

Proposed embodiments may allow for setting the variable capacitor. Non-ideal effects, like parasitics and mismatches, may render an irregular mapping, which may make a highly accurate prediction difficult. The proposed scheme requires no exact knowledge of these non-idealities, which makes it generally applicable while still achieving high resolution. The actual voltage on the reference node is measured and the result is forwarded to a calibration block where based on the measurement value and the DAC code being received an update is determined for the mapping of the DAC code onto the setting for the variable capacitor value. The calibration logic is not so complex, allowing an implementation without significant power consumption increase, which also scales well with technology.

In one embodiment the measurement block comprises a comparator with programmable offset. The programmable offset may be set equal to the difference between a target reference voltage on the reference node and the external reference voltage.

In an embodiment the circuit is arranged for updating the offset when the variable capacitor reaches a given threshold value.

In another embodiment the capacitor network further comprises a variable reset capacitor on the reference node arranged for being pre-charged to a second external auxiliary voltage and for being connected to the reference node when a DAC reset occurs.

In an embodiment the circuit further comprises an additional quantizer for determining the DAC code.

In one embodiment the circuit further comprises storage for storing the updated setting.

In one embodiment the measurement block comprises an A/D converter.

In another aspect, disclosed embodiments relate to an analog-to-digital converter comprising a circuit as described above.

In one embodiment the analog-to-digital converter is implemented as a successive approximation register ADC, a pipelined ADC or a pipelined successive approximation register ADC.

In another embodiment the analog-to-digital converter comprises a plurality of circuits as previously described and a multiplexer. In one embodiment the variable capacitor is common to the plurality of the circuits and connected via the multiplexer. Alternatively, the variable reset capacitor is common to the plurality of the circuits and connected via the multiplexer. In yet another embodiment to the plurality of the circuits commonly share the measurement block, which is connected via the multiplexer.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE FIGURES

Various embodiments will now be described further, by way of example, with reference to the accompanying drawings, wherein like reference numerals refer to like elements in the various figures.

DETAILED DESCRIPTION

Figure 1:
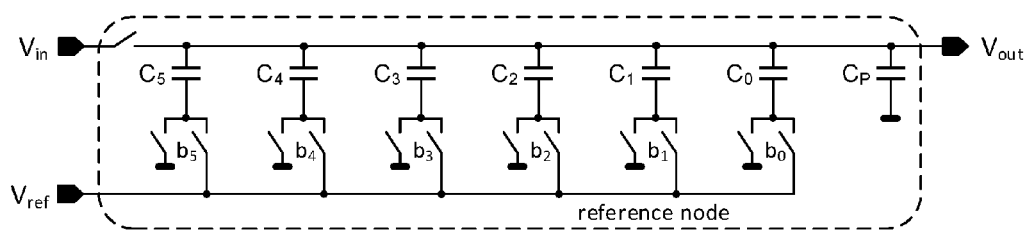
FIG. 1 illustrates an example of a capacitive DAC with 6 bit resolution to generate a residue voltage, according to example embodiments.
Figure 2:
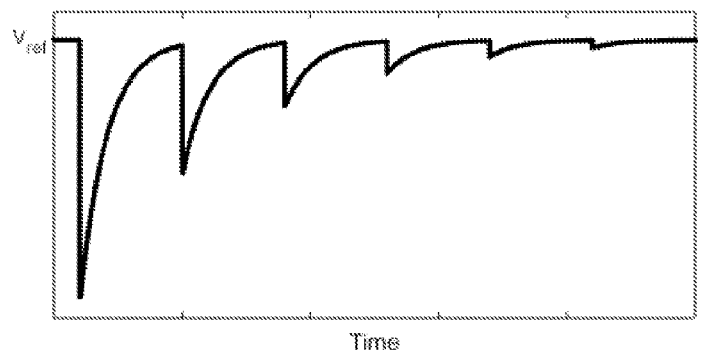
FIG. 2 illustrates a reference voltage at the output of an on-chip buffer with a switching capacitive DAC without the use of any reference stabilization technique, according to example embodiments.
Figure 3:
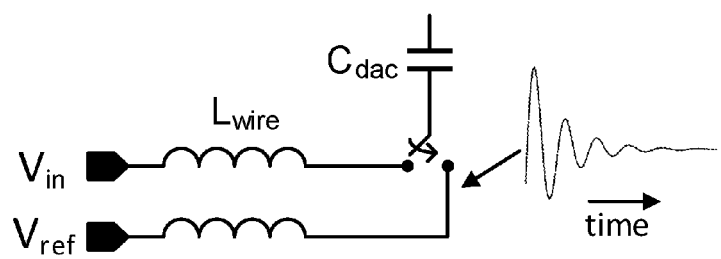
FIG. 3 illustrates a reference voltage connected to an output pin when the DAC switches, according to example embodiments.

Example embodiments will be described with reference to certain drawings, but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

It is to be noticed that the term "comprising", used in the claims, should not be interpreted as being restricted to the elements listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to present embodiments, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments, various features are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of various embodiments should not be taken to imply that the terminology is being re-defined herein to be restricted to include any specific characteristics of the features or aspects of the embodiments with which that terminology is associated.

In the description provided herein, numerous specific details are set forth. However, it is understood that embodiments may be practiced without these specific details. In other instances, well-known methods, structures and techniques have not been shown in detail in order not to obscure an understanding of this description.

Example embodiments may include setting the variable capacitor $C_{aux}$ to a value that takes into account parasitic effects that are hard to predict during design time, e.g. parasitic capacitances, and also taking into account changes, e.g. due to process variations, in the DAC characteristics and in the external voltages being applied.

Accurate prediction of the charge drawn by the DAC and, hence, a correct setting for the programmable capacitor $C_{aux}$ is a difficult task. Mismatches, parasitics or variations of the external reference voltages change the ideal value. Furthermore, the variable (in certain embodiments, programmable) capacitor itself suffers from mismatches as well. Making these mismatches small may include large capacitor values resulting in large area, which may not be viable. Furthermore, with the pre-charge voltage $V_{aux}$ equal to zero, large values for $C_{aux}$ would result in a large drop from the nominal $V_{ref}$ to the stabilized reference voltage.

Figure 4:
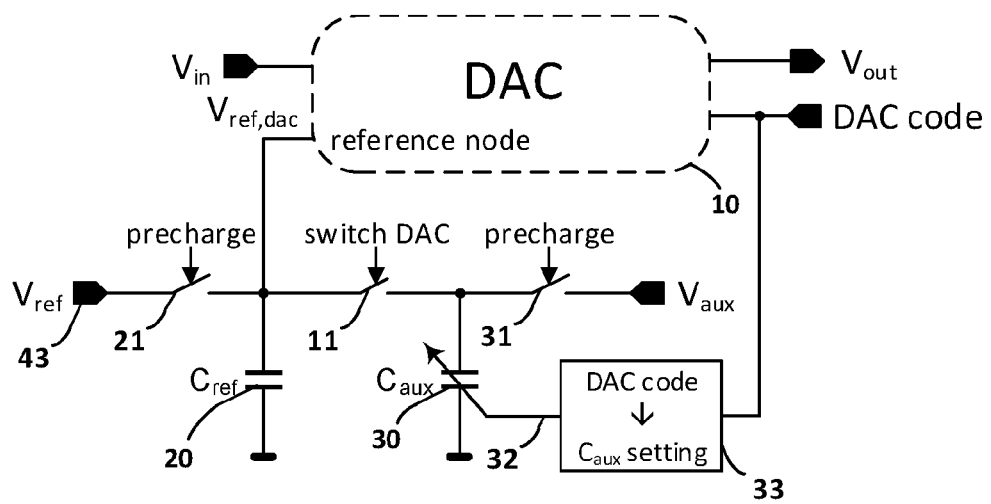
FIG. 4 illustrates a DAC provided with a capacitive network to stabilize the reference voltage.
Figure 5:
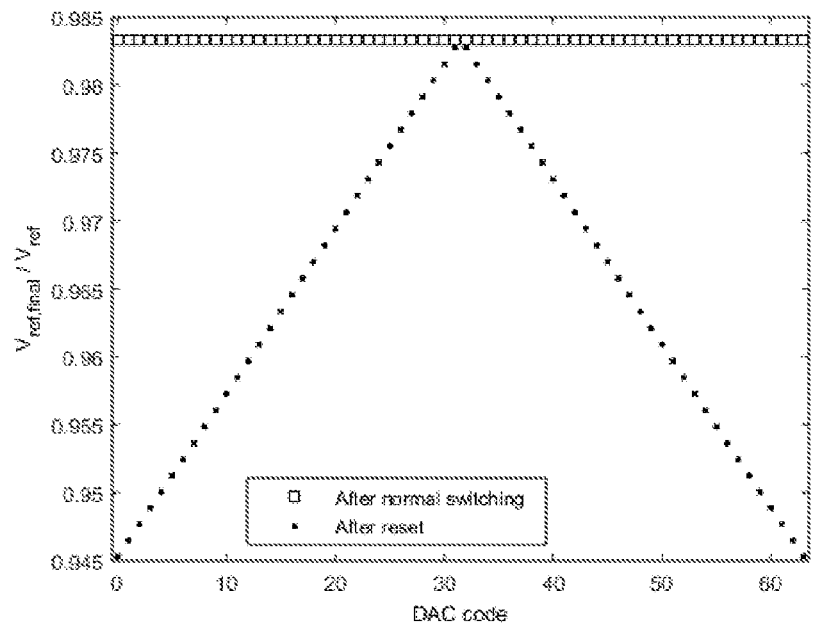
FIG. 5 illustrates a reference voltage at the DAC input after switching the DAC to generate the residue including a capacitive network like the one shown in FIG. 4 (squares), and the reference voltage after subsequently resetting the DAC to its original state (dots) to be ready for the next sample, according to the example embodiments.
Figure 6:
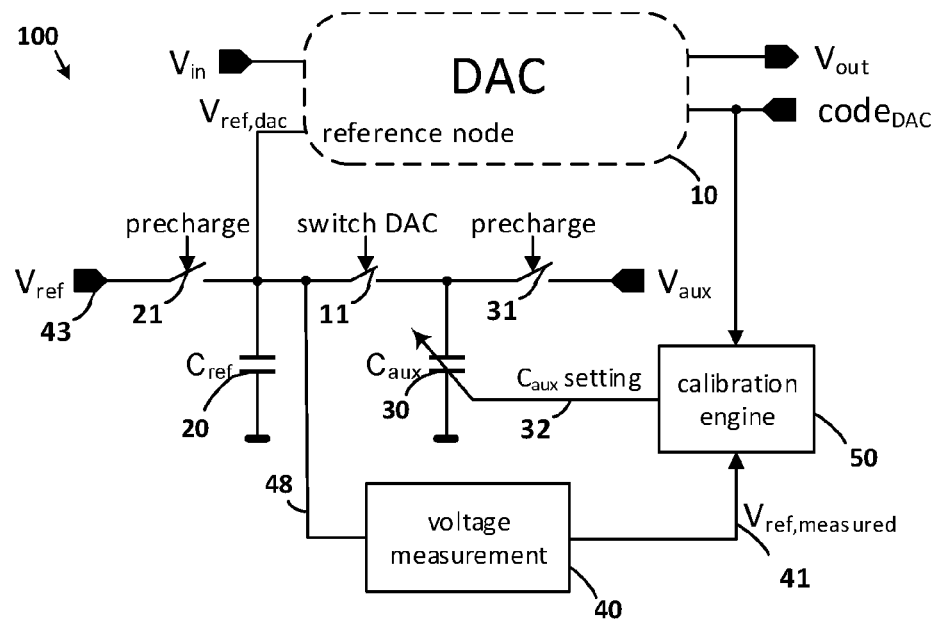
FIG. 6 illustrates a circuit, according to example embodiments.
Figure 7:
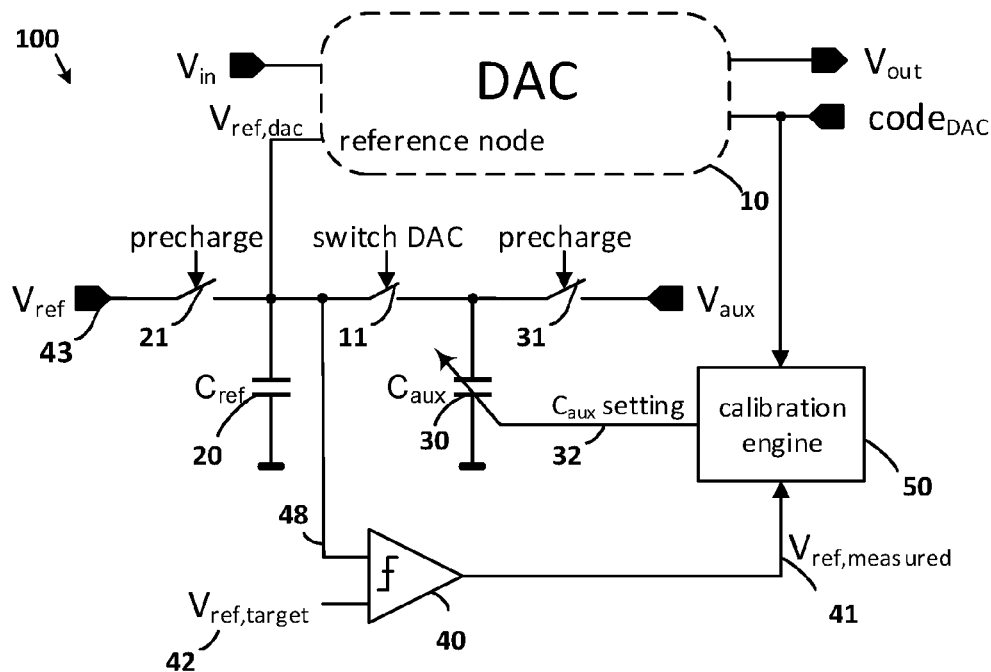
FIG. 7 illustrates a circuit with a comparator or 1-bit ADC used as measurement block, according to example embodiments.

Various embodiments include a scheme that allows achieving high accuracy in the presence of various parasitic effects like parasitic capacitances, mismatches and voltage variations. FIG. 6 illustrates an embodiment of the circuit. Compared to the alternative scheme of FIG. 4, a measurement block (40) and a calibration engine (50) are added to the architecture. The measurement block is activated after the DAC (10) has been switched for a particular DAC code and $C_{aux}$ programmed with a preliminary setting has been connected to the same node. The measurement block measures the resulting voltage on the reference node. The measurement block measures the resulting voltage $V_{ref,dac}$ on the reference node and returns a digital word $V_{ref,measured}$ which corresponds to the magnitude of the voltage on the reference node $V_{ref,dac}$ either in absolute terms or relatively to some target reference voltage. In one embodiment the measurement block is implemented as an A/D converter. Note that this only differs from an implementation with a comparator by the number of bits used to represent the voltage on the reference node, as the comparator can be seen as a 1-bit ADC. In another embodiment this measurement block is arranged for performing a comparison of the voltage on the reference node with a target reference voltage level $V_{ref,target}$ (FIG. 7). The calibration block (50) comprises logic to process the measurement result to update the DAC code mapping onto a setting for the variable capacitor $C_{aux}$. Depending on the measurement result, a register in the calibration block is adapted for that DAC code. This register sums the differences of the voltage on the reference node $V_{ref,dac}$ with the target reference voltage $V_{ref,target}$ for that DAC code. When the register reaches a positive or negative threshold, the total error has become too large and the corresponding setting (32) for $C_{aux}$ for that DAC code is then decreased or increased. The value of the threshold is determined by a trade-off between the speed and noise tolerance of the algorithm: a lower threshold updates the setting for $C_{aux}$ more often. This calibration runs during normal operation of the DAC. Alternatively, the DAC can be switched offline for each of the available DAC codes and the calibration can be run to find an initial mapping of the DAC code onto setting for $C_{aux}$.

Figure 8:
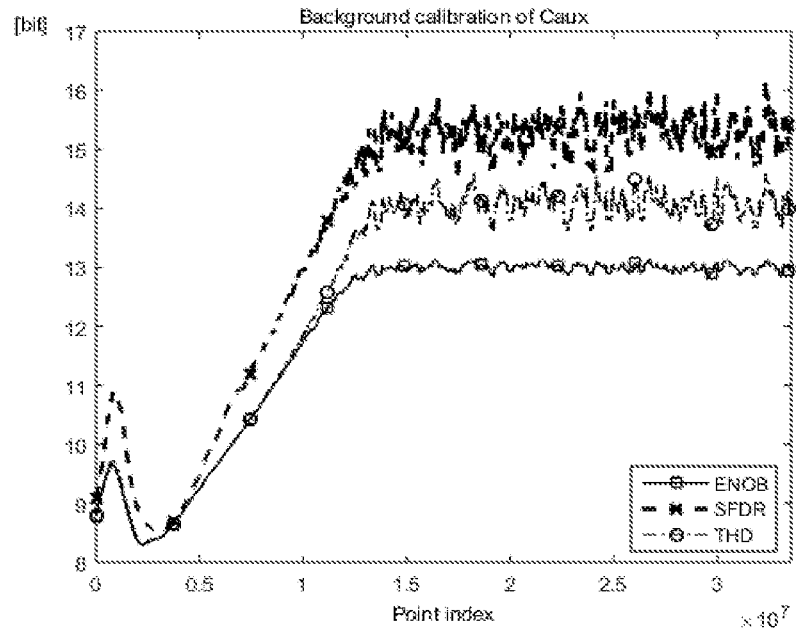
FIG. 8 illustrates the efficiency of the proposed calibration, according to example embodiments.

The efficiency of the proposed calibration is illustrated in FIG. 8, where the accuracy increases until saturation, limited by the resolution of $C_{aux}$. FIG. 8 shows the DAC accuracy over time expressed using three different figures: the effective number of bits (ENOB), spurious-free dynamic range (SFDR) and total harmonic distortion (THD). Over time, the settings for the programmable auxiliary capacitor are updated and the accuracy increases until it settles to a maximum value determined by the resolution of the programmable auxiliary capacitor.

Figure 9:
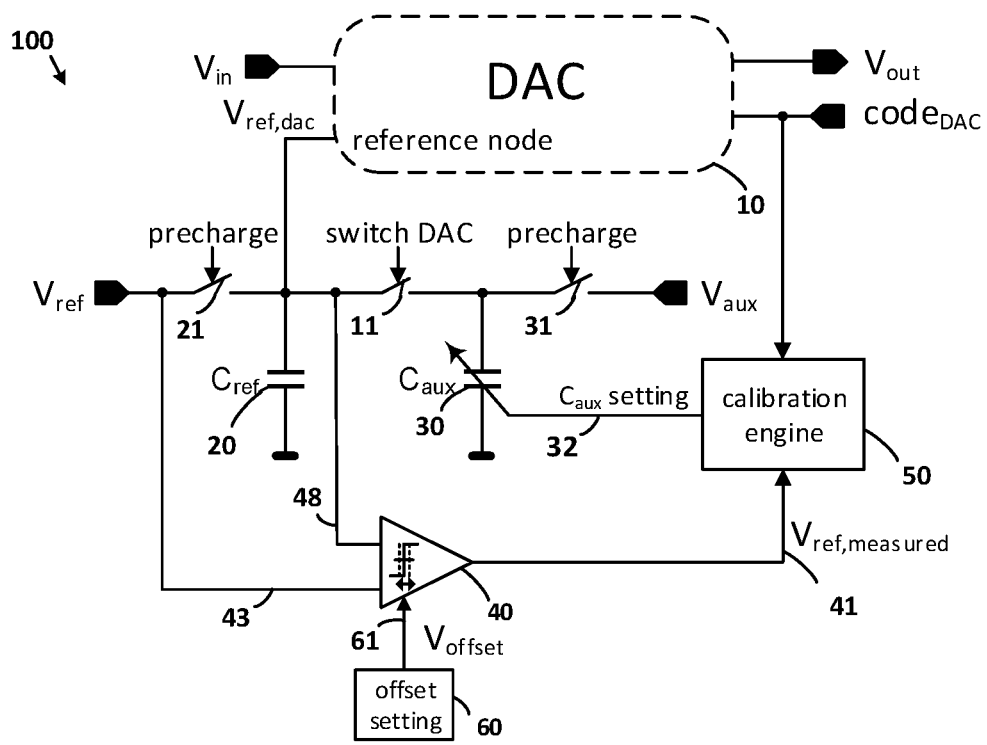
FIG. 9 illustrates an implementation with a comparator with programmable offset as measurement block, according to example embodiments.

Another embodiment is shown in FIG. 9. In this embodiment, with a comparator as measurement block (40), an extra input pin to set the target reference level $V_{ref,target}$ as in FIG. 7 may be avoided. A comparator is used in the measurement block, the offset $V_{offset}$ (61) of which can be set by applying a digital word (60). When the comparator compares with the external reference voltage $V_{ref}$ already available in the system, it effectively compares to a target reference level of $V_{ref,target}=V_{ref}-V_{offset}$. So, the offset corresponds to the difference between the nominal reference voltage $V_{ref}$ and the resulting voltage on the reference node of the DAC after switching. This is not a large value, so a traditional comparator with offset tuning can be employed.

Figure 10:
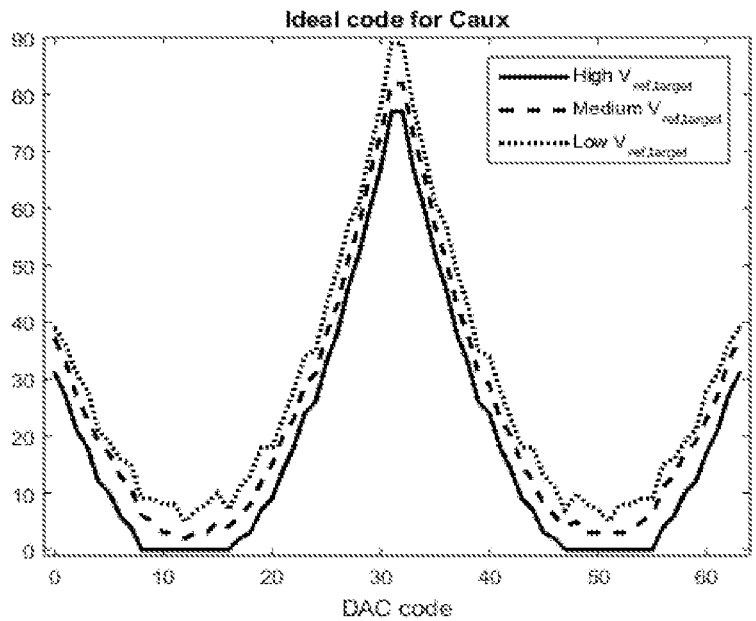
FIG. 10 represents optimized settings for the variable auxiliary capacitor $C_{aux}$, according to example embodiments.

The ideal setting for the programmable auxiliary capacitor $C_{aux}$ to achieve the highest resolution in the presence of various parasitic effects depends on the target reference level $V_{ref,target}$ (either set explicitly via an input pin or implicitly by setting the comparator offset $V_{offset}$) is illustrated in FIG. 10, showing the best mapping of DAC code $b_1 \ldots b_N$ onto setting for $C_{aux}$. Each curve shows the ideal setting for $C_{aux}$ per DAC code for a different target reference level $V_{ref,target}$ (either explicitly specified as in FIG. 7 or implicitly programmed as in FIG. 9). As the ideal curve in FIG. 10 has an irregular character, the proposed calibration technique may be used in order to achieve high resolution.

Figure 11:
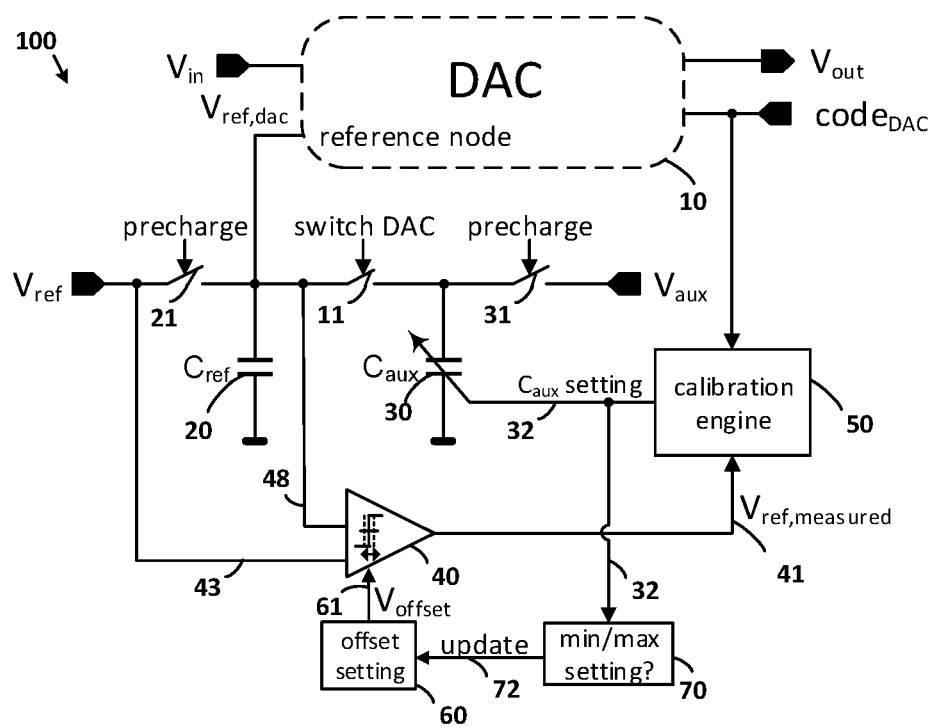
FIG. 11 illustrates the offset tuning of the comparator used as measurement block, according to example embodiments.

When setting the target reference level via the offset programming of the comparator, the system can be made completely autonomous by also tuning the comparator offset in the background as shown in FIG. 11. More precisely, the value of the digital word in the comparator is set automatically to implicitly define the target reference voltage $V_{ref,target}$. The scheme in FIG. 11 comprises logic (70) to determine whether the selected setting for the programmable auxiliary capacitor $C_{aux}$ is the minimum or maximum setting of the available range and updates the digital word (60) for the offset accordingly. When any setting for $C_{aux}$ reaches a minimum or maximum value, the offset (61) is increased or decreased, so that the correct $C_{aux}$ is moved back into the range achievable with the programmable capacitor. For example, when the voltage $V_{aux}$ is ground, the offset should be increased when any $C_{aux}$ setting becomes minimal.

Figure 12:
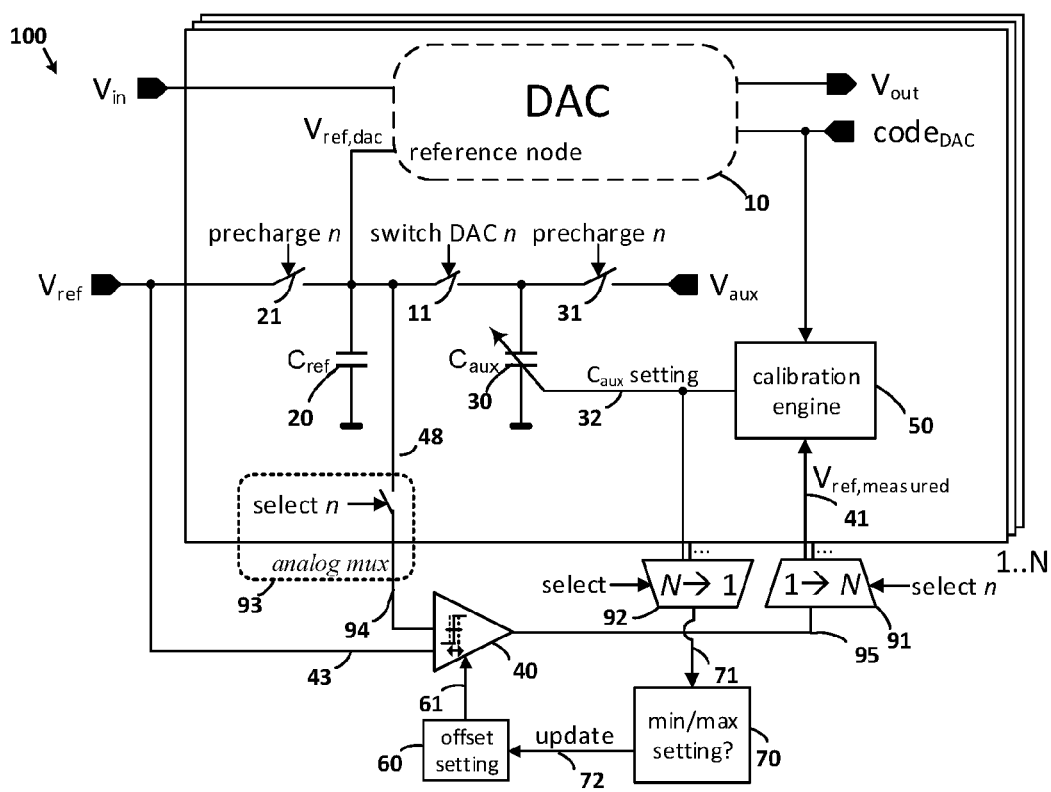
FIG. 12 illustrates the calibration of the variable capacitor in an interleaved ADC system, according to example embodiments.

From equation (1) it is clear that the residue voltage is proportional to the voltage on the DAC reference node. In the case of an interleaved ADC, stabilization of the reference voltage to different reference values consequently results in gain mismatches between the channels of the interleaved ADC. Such mismatches result in spurs in the output spectrum limiting the ADC resolution. To solve this, an analog multiplexer (93) is introduced to subsequently select the reference node of the DACs in the interleaved channels as shown in FIG. 12. Also, a demux (91) is added to send the measurement result to the calibration engine of the right channel. By using a common measurement block (40) to measure the voltage on the reference node and updating the settings for $C_{aux}$ accordingly, this technique ensures there is no gain mismatch anymore between the different channels. In FIG. 12 an embodiment is shown with the measurement block (40) is realized as a comparator with programmable offset (61) with an automatic tuning, an analog mux (93) built with switches to connect the reference nodes of the different channels to one of the comparator inputs, a selector (91) which sends the measurement result to one of the channels, and logic as illustrated in FIG. 9 to update the programmable capacitor setting.

Figure 13:
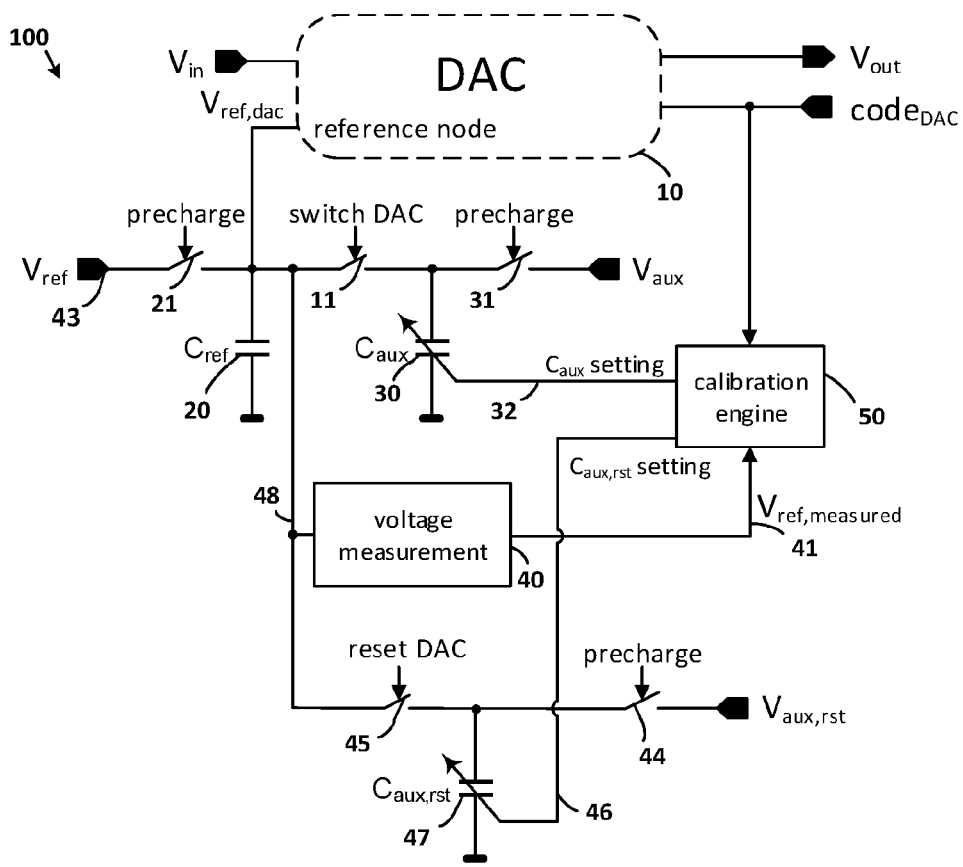
FIG. 13 illustrates the use of a variable capacitor $C_{aux,rst}$ to stabilize the reference voltage after DAC reset, according to example embodiments.

In one embodiment the proposed circuit further comprises a second variable capacitor $C_{aux,rst}$ to stabilize the reference voltage over all DAC codes when resetting the DAC to its initial state. This ensures that even when there is insufficient time during precharging for complete settling of the voltage on $C_{ref}$ to $V_{ref}$, the settling error is always the same and, hence, independent of the DAC code. Consequently, no non-linear errors are introduced. FIG. 13 illustrates this embodiment.

More in particular, an extra programmable capacitor $C_{aux,rst}$ containing a certain number of units is added on the reference node. Its units are first pre-charged to a voltage $V_{aux,rst}$ (e.g., ground) and when resetting the DAC, the corresponding number of units is connected to the reference node. In one embodiment the pre-charge voltage $V_{aux,rst}$ is equal to $V_{aux}$. The setting depends on the DAC code and is retrieved from the calibration block together with the setting for $C_{aux}$ without extra time delay. Also, the reset may happen anyway, so it may not take extra time. During the reset operation, the programmable capacitor $C_{aux}$ can be disconnected from the reference node or it can remain connected. This choice only has a small influence on the values for $C_{aux,rst}$.

The capacitive network used to stabilize the reference voltage after resetting the DAC contains the extra programmable capacitor ($C_{aux,rst}$), a switch to pre-charge this programmable capacitor (44), an input pin $V_{aux,rst}$ (which may be the same as input pin $V_{aux}$ or the electrical ground), a switch to connect the programmable capacitor to the DAC reference node during resetting the DAC (45) and a calibration block (50) to map the DAC code $b_1 \ldots b_N$ onto the correct setting for the programmable capacitor $C_{aux,rst}$.

Figure 14:
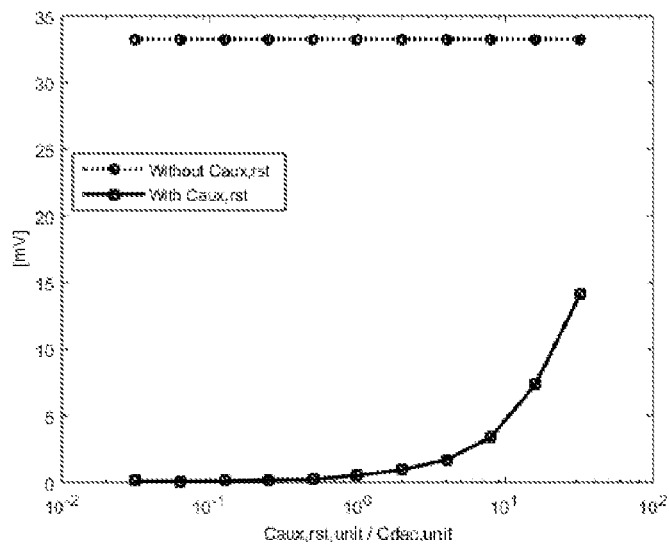
FIG. 14 illustrates the voltage variation on the reference node with (solid) and without (dotted) $C_{aux,rst}$, according to example embodiments.

FIG. 14 illustrates the effect on the voltage variation on the reference node after reset with and without $C_{aux,rst}$ as a function of the resolution of the programmable capacitor $C_{aux,rst}$. The maximum variation of the reference voltage at the DAC input after resetting the DAC to its original state is shown, after it has generated a voltage residue. Different points correspond to different resolutions of the programmable capacitor $C_{aux,rst}$ (expressed as the unit size of this capacitor with respect to the unit size of the DAC). The dotted curve with stars gives the maximum variation without the programmable capacitor (hence, independent of its resolution). The solid curve with squares shows how smaller units (hence, higher resolution) for the programmable capacitor reduce the reference voltage variation. Even with a rather coarse programmable $C_{aux,rst}$ (e.g., a ratio of 1 corresponding to units equal to the units of the main DAC), the variation is greatly reduced.

Figure 15:
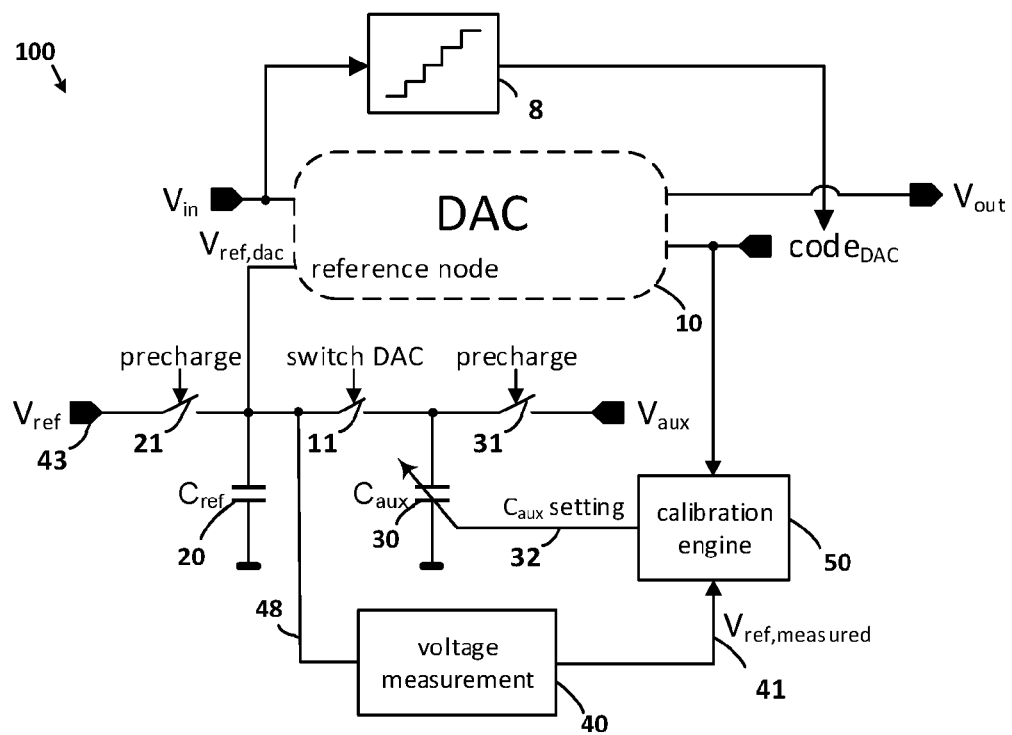
FIG. 15 illustrates a circuit with an extra quantizer enabling the use of $C_{aux}$ only for final residue generation, according to example embodiments.

FIG. 15 illustrates an embodiment that allows using the auxiliary capacitor to stabilize the reference without the use of it during multiple steps of the algorithm. In order to reduce the time delay as much as possible, the programmable capacitor $C_{aux}$ is only connected once per conversion to the DAC reference node. This happens during the most critical step of the algorithm, namely the final residue generation assuming the residue is to be further quantized. The DAC code $b_1 \ldots b_N$ is then determined with an extra quantizer (8) as shown in FIG. 15. This coarse quantizer may not be highly linear. Instead, the DAC is linearized by applying the technique of the auxiliary capacitor only when generating the final residue, which can be further processed to achieve higher overall resolution. The quantizer (8) can be any type of ADC like a flash, SAR or delta-sigma A/D converter. Since the linearity of the residue is mainly determined by the DAC linearity, this quantizer is non-critical. For example, to achieve 14 bit linearity for a 6-bit DAC, the quantizer may be only 6 bit accurate.

For high-speed operation the DAC is often used in an interleaved ADC. For this configuration, multiplexers are introduced to reduce the area required for the programmable capacitor.

Figure 16:
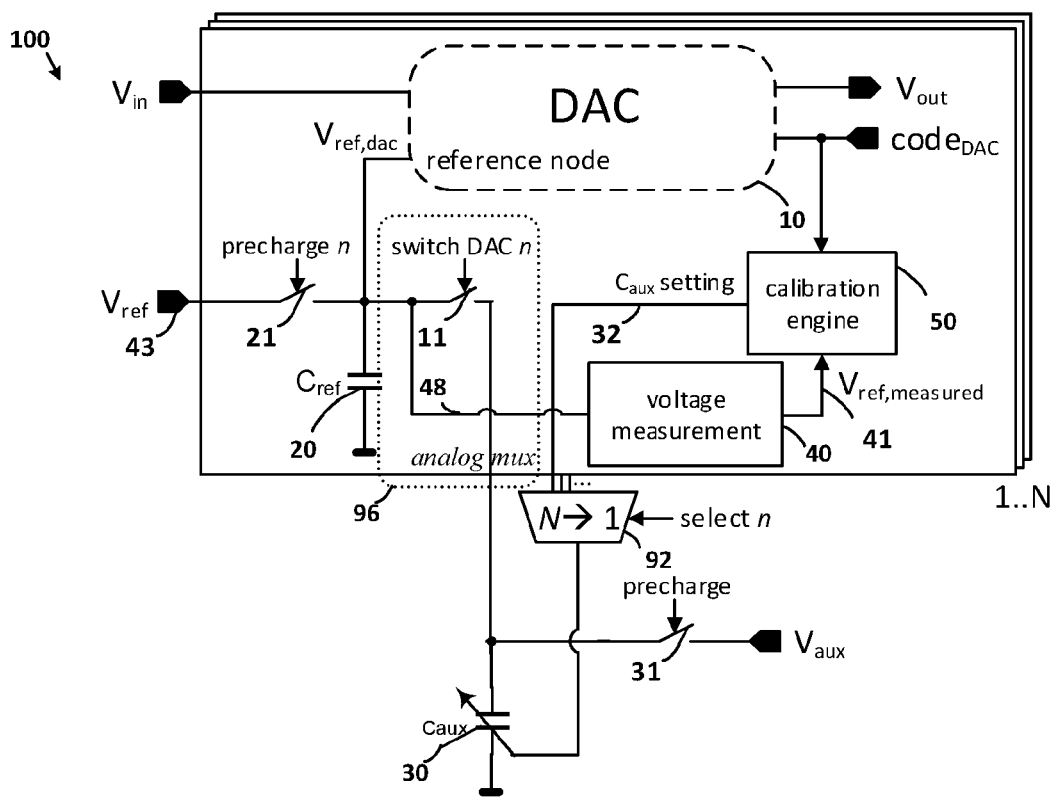
FIG. 16 illustrates a shared $C_{aux}$ in an interleaved ADC, according to example embodiments.

FIG. 16 illustrates the technique of the programmable auxiliary capacitor $C_{aux}$ in an interleaved system. Instead of applying the technique for each channel individually, it contains a single programmable capacitor $C_{aux}$, a switch (31) to pre-charge the programmable capacitor, an input pin $V_{aux}$ to indicate the level to which the programmable capacitor should be pre-charged (which can be equal to the electrical ground), an analog mux (96) built of switches (11) to connect the programmable capacitor to the reference nodes in the different channels, logic or a memory to map the DAC code in each channel onto a setting for the programmable capacitor, and a multiplexer (92) that subsequently selects the setting for the auxiliary DAC per channel.

Figure 17:
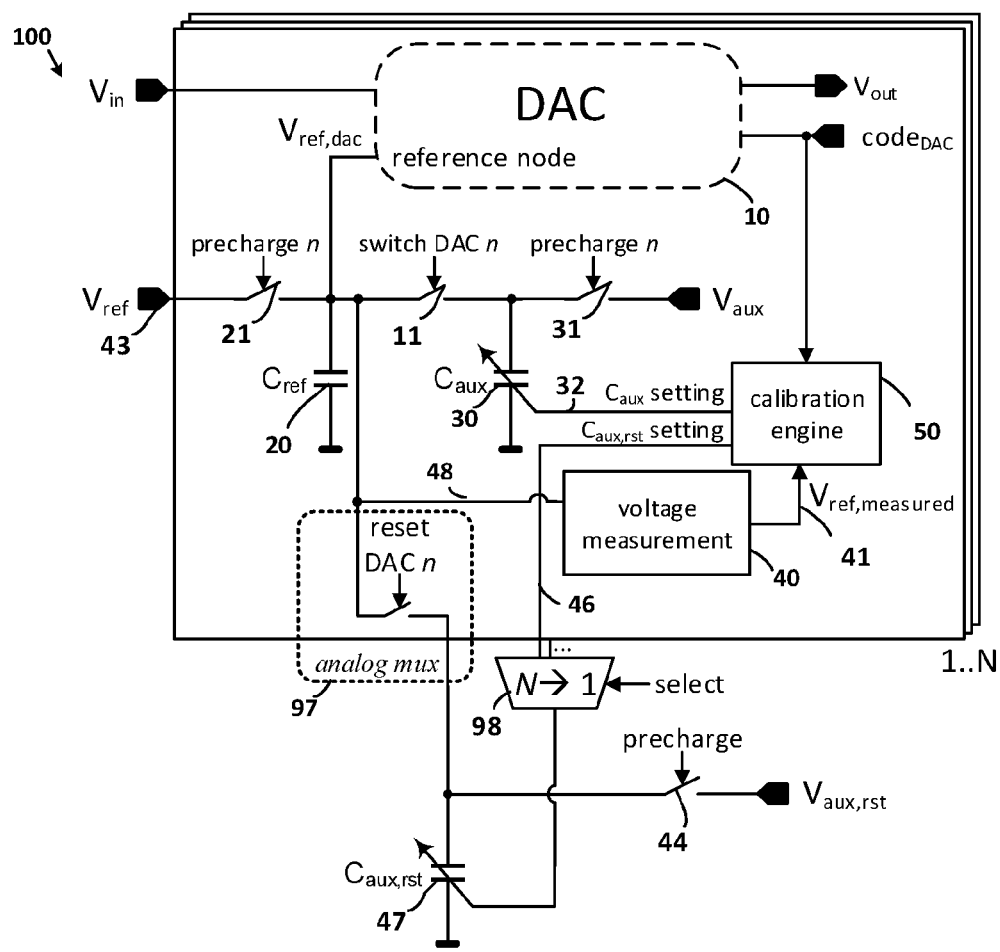
FIG. 17 illustrates a shared $C_{aux,rst}$ in an interleaved ADC, according to example embodiments.

FIG. 17 illustrates the use of the programmable auxiliary capacitor $C_{aux,rst}$ during resetting the DAC in an interleaved system. Instead of applying the technique for each channel individually, it contains a single programmable capacitor $C_{aux,rst}$, a switch (44) to pre-charge the programmable auxiliary capacitor, an input pin $V_{aux,rst}$ to indicate the level to which the programmable capacitor should be pre-charged and which can be equal to pin $V_{aux}$ used for the programmable capacitor used during normal switching of the DAC, or the electrical ground, an analog mux (97) built of switches to connect the programmable capacitor to the reference nodes in the different channels, logic or a memory to map the DAC code in each channel onto a setting for the programmable capacitor, and a multiplexer (98) that subsequently selects the setting for the auxiliary DAC per channel.

The proposed scheme offers a variety of benefits. The area is significantly reduced, as there may not be a need for a large reference capacitor. In a time-interleaved ADC the overhead of $C_{aux}$ and $C_{aux,rst}$ can be shared among different channels. There is no significant increase in power consumption. The main component of power consumption may occur in the logic to program the capacitors. This purely digital power scales well with technology. Also, the calibration technique is not too complex to significantly increase the power consumption. The DAC itself may not need to be adapted, which makes various embodiments generally applicable and independent of DAC parasitics. The techniques are also compatible with each other. The calibration technique works autonomously without interrupting the normal ADC operation.

While various embodiments have been illustrated and described in detail in the drawings and foregoing description, such illustration and description are to be considered illustrative and not restrictive. The foregoing description details certain embodiments. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A circuit for stabilizing a voltage on a reference node, comprising:
a digital-to-analog converter comprising an array of capacitors and arranged for:
receiving an input voltage ($V_{in}$) via an input node;
receiving a voltage ($V_{ref,DAC}$) via a reference node and a digital-to-analog code ($code_{DAC}$) via a controller node, wherein the digital-to-analog code indicates which capacitors of the array of capacitors to which the voltage ($V_{ref,DAC}$) is to be applied; and
outputting a digital-to-analog output voltage ($V_{out}$);
a capacitive network on the reference node comprising a fixed capacitor ($C_{ref}$) arranged to be pre-charged to an external reference voltage ($V_{ref}$) and a variable capacitor ($C_{aux}$) arranged to be pre-charged to an external auxiliary voltage ($V_{aux}$) and afterwards to be connected to the reference node;
a measurement block arranged for measuring the voltage on the reference node; and
a calibration block arranged for receiving the digital-to-analog code and the measured voltage on the reference node and for determining an updated setting of the variable capacitor based on the digital-to-analog code and the measured voltage on the reference node.

2. The circuit according to claim 1, wherein the measurement block comprises a comparator arranged to compare the voltage ($V_{ref,DAC}$) on the reference node with an external target reference voltage ($V_{ref,target}$).

3. The circuit according to claim 1, wherein the measurement block comprises a comparator with a programmable offset.

4. The circuit according to claim 3, wherein the programmable offset is set equal to a difference between a target reference voltage ($V_{ref,target}$) on the reference node and the external reference voltage.

5. The circuit according to claim 3, arranged for updating the programmable offset when the variable capacitor ($C_{aux}$) reaches a threshold value.

6. The circuit according to claim 1, wherein the capacitive network further comprises a variable reset capacitor ($C_{aux,rst}$) on the reference node arranged for being pre-charged to a second external auxiliary voltage ($V_{aux,rst}$) and for being connected to the reference node when the digital-to-analog converter resets.

7. The circuit according to claim 1, further comprising an additional quantizer for determining the digital-to-analog code.

8. The circuit according to claim 1, wherein the measurement block comprises an analog-to-digital converter.

9. The circuit according to claim 1, further comprising storage for storing the updated setting.

10. An analog-to-digital converter, comprising a circuit for stabilizing a voltage on a reference node, wherein the circuit comprises:
   a digital-to-analog converter comprising an array of capacitors and arranged for:
      receiving an input voltage ($V_{in}$) via an input node;
      receiving a voltage ($V_{ref,DAC}$) via a reference node and a digital-to-analog code ($code_{DAC}$) via a controller node, wherein the digital-to-analog code indicates which capacitors of the array of capacitors to which the voltage ($V_{ref,DAC}$) is to be applied; and
      outputting a digital-to-analog output voltage ($V_{out}$);
   a capacitive network on the reference node comprising a fixed capacitor ($C_{ref}$) arranged to be pre-charged to an external reference voltage ($V_{ref}$) and a variable capacitor ($C_{aux}$) arranged to be pre-charged to an external auxiliary voltage ($V_{aux}$) and afterwards to be connected to the reference node;
   a measurement block arranged for measuring the voltage on the reference node; and
   a calibration block arranged for receiving the digital-to-analog code and the measured voltage on the reference node and for determining an updated setting of the variable capacitor based on the digital-to-analog code and the measured voltage on the reference node.

11. The analog-to-digital converter, according to claim 10, wherein the measurement block comprises a comparator arranged to compare the voltage ($V_{ref,DAC}$) on the reference node with an external target reference voltage ($V_{ref,target}$).

12. The analog-to-digital converter, according to claim 10, wherein the measurement block comprises a comparator with a programmable offset.

13. The analog-to-digital converter, according to claim 12, wherein the programmable offset is set equal to a difference between a target reference voltage ($V_{ref,target}$) on the reference node and the external reference voltage.

14. The analog-to-digital converter, according to claim 12, wherein the circuit is arranged for updating the programmable offset when the variable capacitor ($C_{aux}$) reaches a threshold value.

15. The analog-to-digital converter, according to claim 10, wherein the capacitive network further comprises a variable reset capacitor ($C_{aux,rst}$) on the reference node arranged for being pre-charged to a second external auxiliary voltage ($V_{aux,rst}$) and for being connected to the reference node when the digital-to-analog converter resets.

16. The analog-to-digital converter according to claim 10, implemented as a successive approximation register analog-to-digital converter, a pipelined analog-to-digital converter, or a pipelined successive approximation register analog-to-digital converter.

17. An analog-to-digital converter, comprising:
   a multiplexer; and
   a plurality of circuits for stabilizing a voltage on a reference node, wherein each circuit comprises:
      a digital-to-analog converter comprising an array of capacitors and arranged for:
         receiving an input voltage ($V_{in}$) via an input node;
         receiving a voltage ($V_{ref,DAC}$) via a reference node and a digital-to-analog code ($code_{DAC}$) via a controller node, wherein the digital-to-analog code indicates which capacitors of the array of capacitors to which the voltage ($V_{ref,DAC}$) is to be applied; and
         outputting a digital-to-analog output voltage ($V_{out}$);
      a capacitive network on the reference node comprising a fixed capacitor ($C_{ref}$) arranged to be pre-charged to an external reference voltage ($V_{ref}$) and a variable capacitor ($C_{aux}$) arranged to be pre-charged to an external auxiliary voltage ($V_{aux}$) and afterwards to be connected to the reference node;
      a measurement block arranged for measuring the voltage on the reference node; and
      a calibration block arranged for receiving the digital-to-analog code and the measured voltage on the reference node and for determining an updated setting of the variable capacitor based on the digital-to-analog code and the measured voltage on the reference node.

18. The analog-to-digital converter according to claim 17, wherein the variable capacitor ($C_{aux}$) is common to the plurality of circuits and connected via the multiplexer.

19. The analog-to-digital converter according to claim 17, wherein the capacitive network further comprises a variable reset capacitor ($C_{aux,rst}$) on the reference node arranged for being pre-charged to a second external auxiliary voltage ($V_{aux,rst}$) and for being connected to the reference node when the digital-to-analog converter resets, and
   wherein the variable reset capacitor ($C_{aux,rst}$) is common to the plurality of circuits and connected via the multiplexer.

20. The analog-to-digital converter according to claim 17, wherein the measurement block is common to the plurality of circuits and connected via the multiplexer.

* * * * *